United States Patent
Lu

(10) Patent No.: US 9,971,373 B1
(45) Date of Patent: May 15, 2018

(54) REFERENCE VOLTAGE GENERATOR

(71) Applicant: AUCMOS Technologies USA, Inc., Santa Clara, CA (US)

(72) Inventor: Teh-Shang Lu, Sunnyvale, CA (US)

(73) Assignee: AUCMOS Technologies USA, Inc., Santa Clara, CA (US)

( * ) Notice: Subject to any disclaimer, the term of this patent is extended or adjusted under 35 U.S.C. 154(b) by 0 days. days.

(21) Appl. No.: 15/391,966

(22) Filed: Dec. 28, 2016

(51) Int. Cl.
*G05F 3/24* (2006.01)
*H03H 7/01* (2006.01)

(52) U.S. Cl.
CPC ............. *G05F 3/24* (2013.01); *H03H 7/0138* (2013.01)

(58) Field of Classification Search
CPC .............................................. G05F 3/24–3/247
See application file for complete search history.

(56) References Cited

U.S. PATENT DOCUMENTS

| | | | | |
|---|---|---|---|---|
| 5,109,187 A * | 4/1992 | Guliani | ................... | G05F 3/247 323/315 |
| 5,359,327 A * | 10/1994 | Brown | ...................... | G05F 3/18 327/326 |
| 5,394,036 A * | 2/1995 | Hanna | ................ | H03H 11/1252 327/311 |
| 7,426,146 B2 * | 9/2008 | Aota | ...................... | G11C 5/147 365/189.09 |
| 2003/0143796 A1 * | 7/2003 | La Rosa | ................. | G05F 3/262 438/200 |
| 2006/0141963 A1 * | 6/2006 | Maxim | ................. | H03L 7/0891 455/192.1 |
| 2009/0085534 A1 * | 4/2009 | Ko | .......................... | G05F 1/575 323/270 |
| 2009/0195302 A1 * | 8/2009 | Lin | ......................... | H03F 3/505 327/543 |
| 2010/0207686 A1 * | 8/2010 | Lai | ............................ | G05F 3/24 327/541 |
| 2010/0327842 A1 * | 12/2010 | Seok | ....................... | G05F 3/242 323/313 |
| 2014/0266140 A1 * | 9/2014 | Iriarte | ..................... | G05F 3/242 323/313 |

* cited by examiner

*Primary Examiner* — Thomas J Hiltunen
(74) *Attorney, Agent, or Firm* — VLP Law Group, LLP; Edward C. Kwok, Esq.

(57) ABSTRACT

A reference voltage generation circuit includes (a) a native MOS transistor coupled to between a power supply voltage source, and the output terminal of the reference voltage generation circuit; (b) an enhancement mode MOS transistor coupled between the output terminal and ground; and (c) a filter circuit that are coupled to the gate terminals of both the native MOS transistor, the enhancement mode transistor and the output terminal of the reference voltage generation circuit, in which the filter circuit has a transfer function including one or more zeroes at predetermined noise frequencies.

5 Claims, 4 Drawing Sheets

REFERENCE VOLTAGE GENERATOR

BACKGROUND OF THE INVENTION

1. Field of the Invention

The present invention relates to circuit designs. Specifically, the present invention relates to reference voltage generation circuits in an integrated circuit.

2. Discussion of the Related Art

FIG. 1 shows conventional reference voltage generation circuit 100. As shown in FIG. 1, reference voltage generation circuit 100 includes one or more gate-source connected transistors ("diode-connected transistors") 101, depletion mode transistors 102 and enhancement mode transistor 103, serially connected as shown between power supply voltage $V_{DD}$ and ground. Reference voltage $V_{REF}$ is taken from common terminal 104 shared between enhancement mode transistor 103 and depletion mode transistor 102. (In some instances, depletion mode transistor 102 may be substituted by an enhancement mode transistor, as is understood by those of ordinary skill in the art). Reference voltage $V_{REF}$ at terminal 104 is fed back to the gate terminals of depletion mode transistor 102 and enhancement mode transistor 103. Reference voltage $V_{REF}$ is given by the equation:

$$V_{REF} = -\frac{k_2}{k_1}(V_{t2}) + V_{t1} \quad (1)$$

where $V_{t1}$ and $V_{t2}$ are the threshold voltages of transistors 102 and 103, respectively, $V_{t2}$ being a negative value and $V_{t1}$ is a positive value, and $k_1$ and $k_2$ are values that depend on the sizes of transistors 102 and 103, respectively. In most MOS transistor designs, many designers use the ratio of its channel width to its channel length to represent the size of a transistor, as is known to those of ordinary skill in the art. $k_1$ and $k_2$ are proportional to the capacitance of the MOS capacitor ($C_{ox}$), and the channel width to channel length ratio (W/L) of their respective transistor. Therefore, if transistors 102 and 103 are sized identically, $V_{REF}$ would equal the sum of their threshold voltages:

$$V_{REF} = -V_{t2} + V_{t1}$$

In reference voltage generation circuit 100, voltage $V_X$ at terminal 105 satisfies by the following inequality:

$$V_X > V_{REF} + V_{DSAT} \quad (2)$$

where $V_{DSAT}$ is the voltage drop across the drain terminal and the source terminal of enhancement mode transistor 103 at saturation current. Therefore, voltage $V_X$ is typically biased larger than ($V_{REF} + V_{DSAT}$), which can be achieved using a replica biasing scheme known to those of ordinary skill in the art.

Typical threshold voltages for depletion mode transistor 102 and enhancement mode transistor 103 are −0.5 volts and 0.7 volts respectively. A typical value for voltage $V_{DS\text{-}SAT}$ is approximately 0.3 volts. The number of diode-connected transistors 101 is determined by the voltage difference ("headroom") between power supply voltage $V_{DD}$ and voltage $V_X$.

Reference voltage generation circuit 100 has the disadvantage that it does not operate under a low power supply voltage conditions (e.g., when voltage $V_{DD}$ is lower than 1.8 volts), such may occur in mobile applications. Furthermore, reference voltage generation circuit 100 is also susceptible to noise in mobile applications.

SUMMARY

According to one embodiment of the present invention, a reference voltage generation circuit providing a reference voltage at an output terminal. The reference voltage generation circuit includes (a) a native MOS transistor having a gate terminal, a source terminal and a drain terminal, the drain terminal being coupled to a power supply voltage source, and the source terminal being coupled to the output terminal to provide the reference voltage; (b) an enhancement mode MOS transistor having a gate terminal, a drain terminal and a source terminal, the drain terminal being coupled to the output terminal, and the source terminal being coupled to ground; and a filter circuit coupled to the gate terminal of the native MOS transistor, the gate terminal of the enhancement mode transistor and the output terminal, the filter circuit having a transfer function including one or more zeroes. One of the zeroes may be provided, for example, at 217 Hz. The filter circuit may include two or more of: resistors, capacitors and inductors. The reference voltage generation circuit may further include one or more diode-connected additional MOS native transistor that are connected in series.

According to one embodiment, of the present invention, the reference voltage generation circuit may further include a switch circuit which, when conducting, allows a current to flow between the power supply voltage source and the additional native MOS transistors.

The present invention is better understood upon consideration of the detailed description below in conjunction with accompanying drawings.

DETAILED DESCRIPTION OF THE PREFERRED EMBODIMENT

Figure 1:
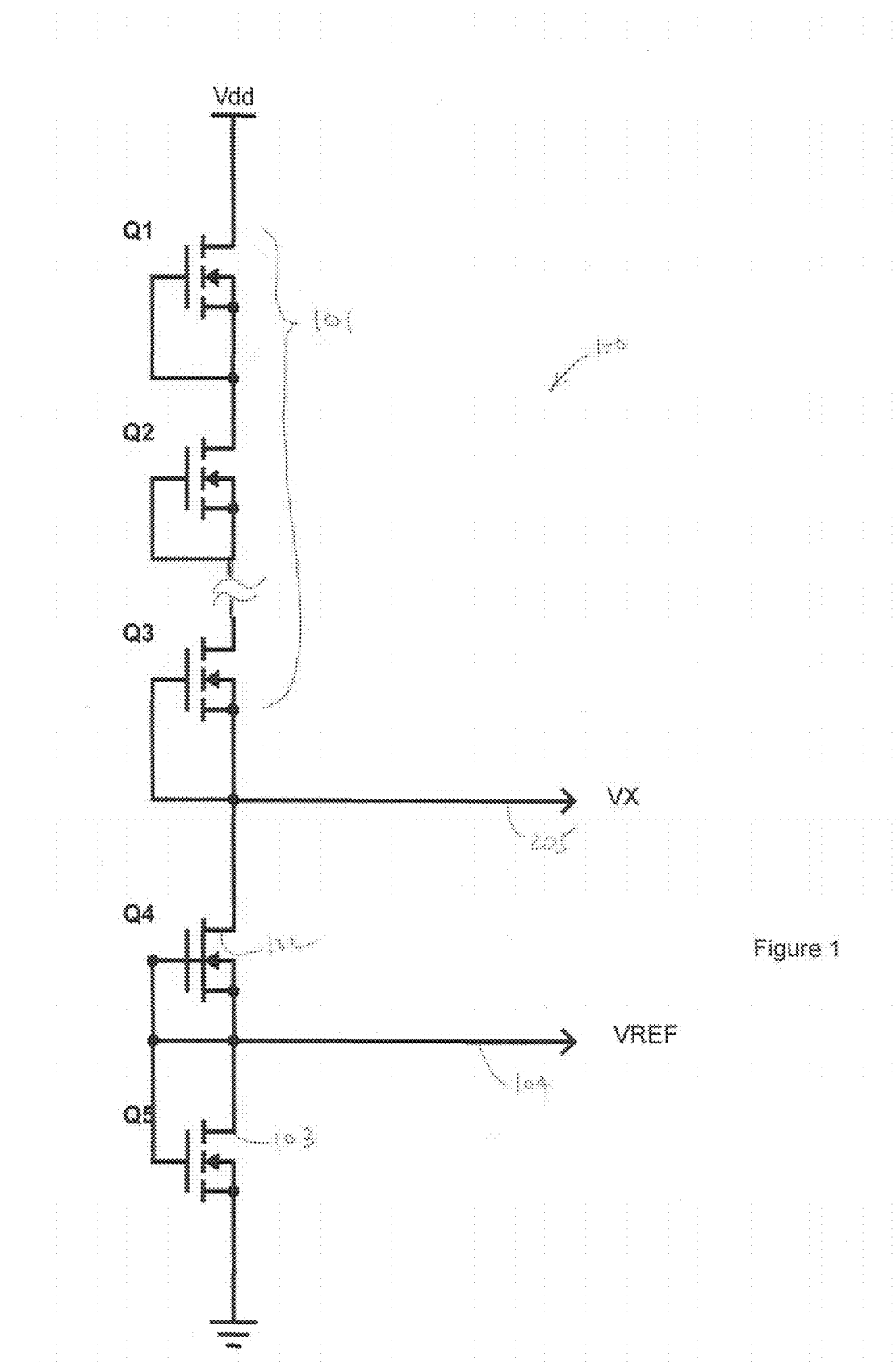
FIG. 1 shows convention reference voltage generation circuit 100.
Figure 2:
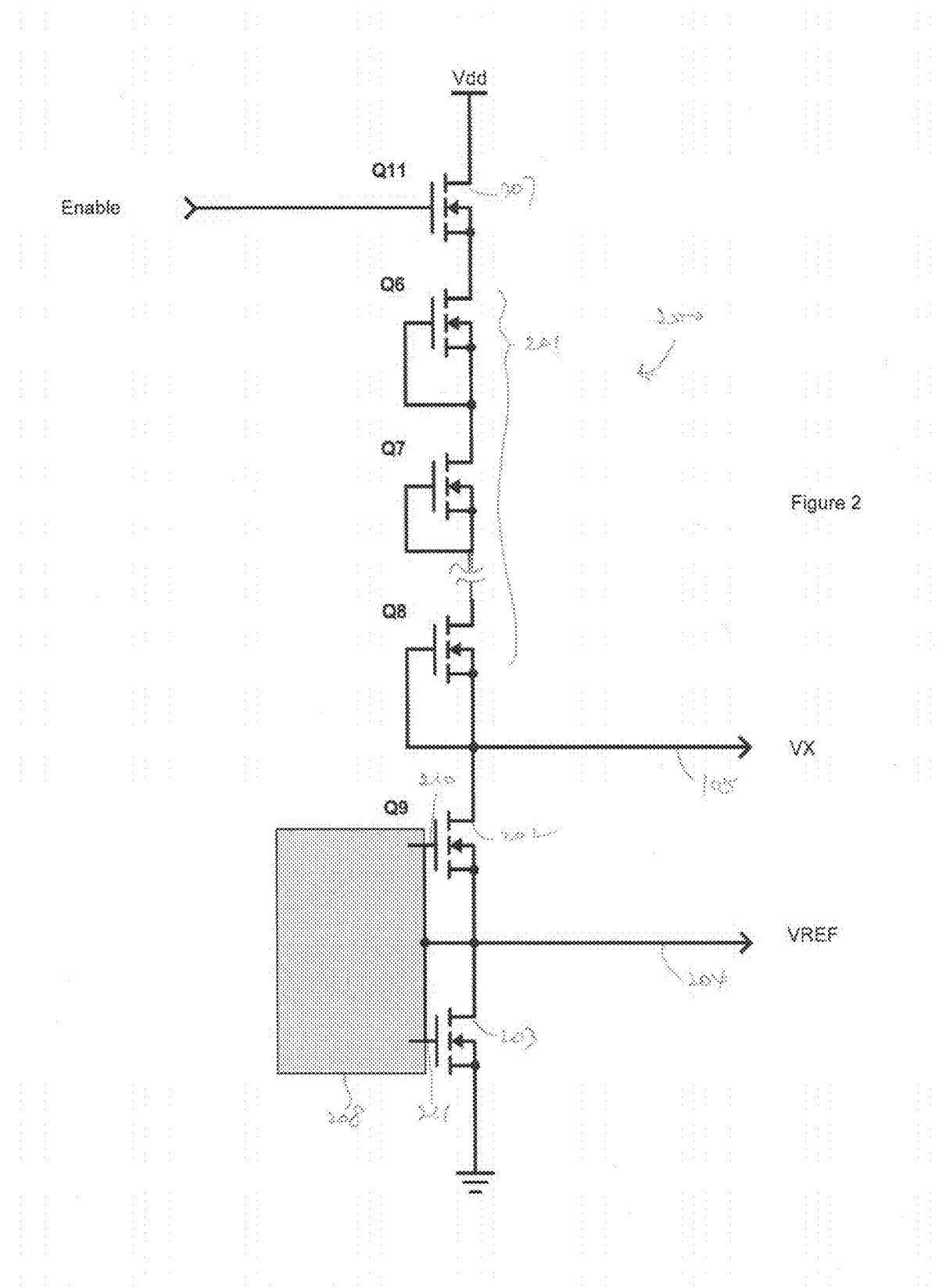
FIG. 2 is a schematic diagram showing reference voltage generation circuit 200, according one embodiment of the present invention.

FIG. 2 is a schematic diagram showing reference voltage generation circuit 200, according to one embodiment of the present invention. As shown in FIG. 2, reference voltage generation circuit 100 includes switch 207, one or more diode-connected native MOS transistors 201, native MOS transistors 202 and enhancement mode transistor 203, serially connected as shown between power supply voltage $V_{DD}$ and ground. In addition, output terminals 205 and 206 of filter circuit 208 controls the gate terminals of native transistor 202 and enhancement mode transistor 203, respectively. As explained in further detail below, filter circuit 208 provides noise immunity to reference voltage generation circuit 200. Reference voltage $V_{REF}$ is taken from common terminal 204, which is fed back to filter circuit 208. Filter circuit 208 drives both the gate terminals 210 and 211 of native MOS transistor 202 and enhancement mode transistor 203, respectively, and receives reference voltage $V_{REF}$ at terminal 204, Switch 207 may be any transistor provided, when conducting, to allow a current to flow in diode-connected native MOS transistors 201, native MOS transistors 202 and enhancement mode transistor 203. The design consideration for voltage $V_X$ at terminal 205 is substantially the same as that for voltage $V_X$ at terminal 105 of FIG. 1.

Unlike depletion mode transistor 102 of FIG. 1—which has a negative threshold voltage of approximately −0.5 volts—a native transistor have a near-zero threshold voltage. Accordingly, reference voltage generation circuit 200 may operate even at low power supply voltage conditions.

Figure 3:
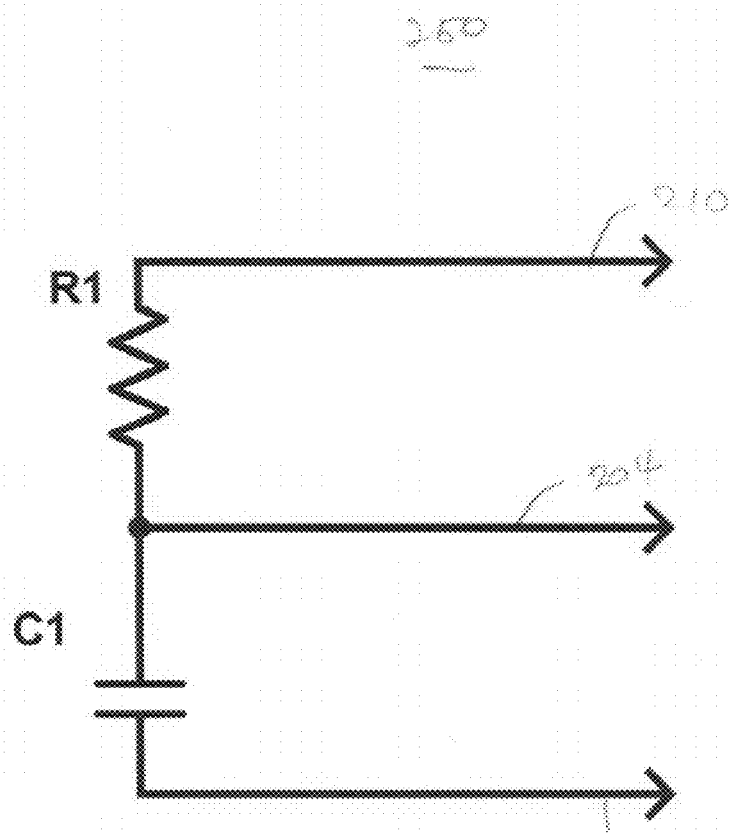
FIG. 3 shows filter circuit 250, which may be used to implement filter circuit 208 of reference voltage generation circuit 200 of FIG. 2, in accordance with one embodiment of the present invention.

Filter circuit 208 may be implemented by a RC circuit having zeroes to attenuate noise at one or more selected frequencies. For example, in a mobile telephone, a conventional ringtone is provided at 217 Hz. If the RC circuit in filter circuit 208 has a transfer function which includes a zero at 217 Hz, reference voltage generation circuit 200 would be provided noise immunity from the ringtone. (As is known to those of ordinary skill in the art, a "zero" in a transfer function is a frequency at which the numerator of the transfer function becomes zero; conversely, a "pole" in a transfer function is a frequency at which the denominator of the transfer function becomes zero). FIG. 3 shows filter circuit 250, which may be used to implement filter circuit 208 of reference voltage generation circuit 200 of FIG. 2, in accordance with one embodiment of the present invention. As shown in FIG. 3, filter circuit 250 includes a resistor connected between As shown in FIG. 3, filter circuit 208 includes a resistor of value R and a capacitor of value C. Filter circuit 250 has a transfer function of $$\frac{RC\omega}{1+RC\omega},$$

where ω is frequency. If the values R and C are selected such that $$\frac{1}{RC}$$

equals 217 Hz, reference voltage generation circuit 200 would have noise immunity at the 217 Hz.

Figure 4:
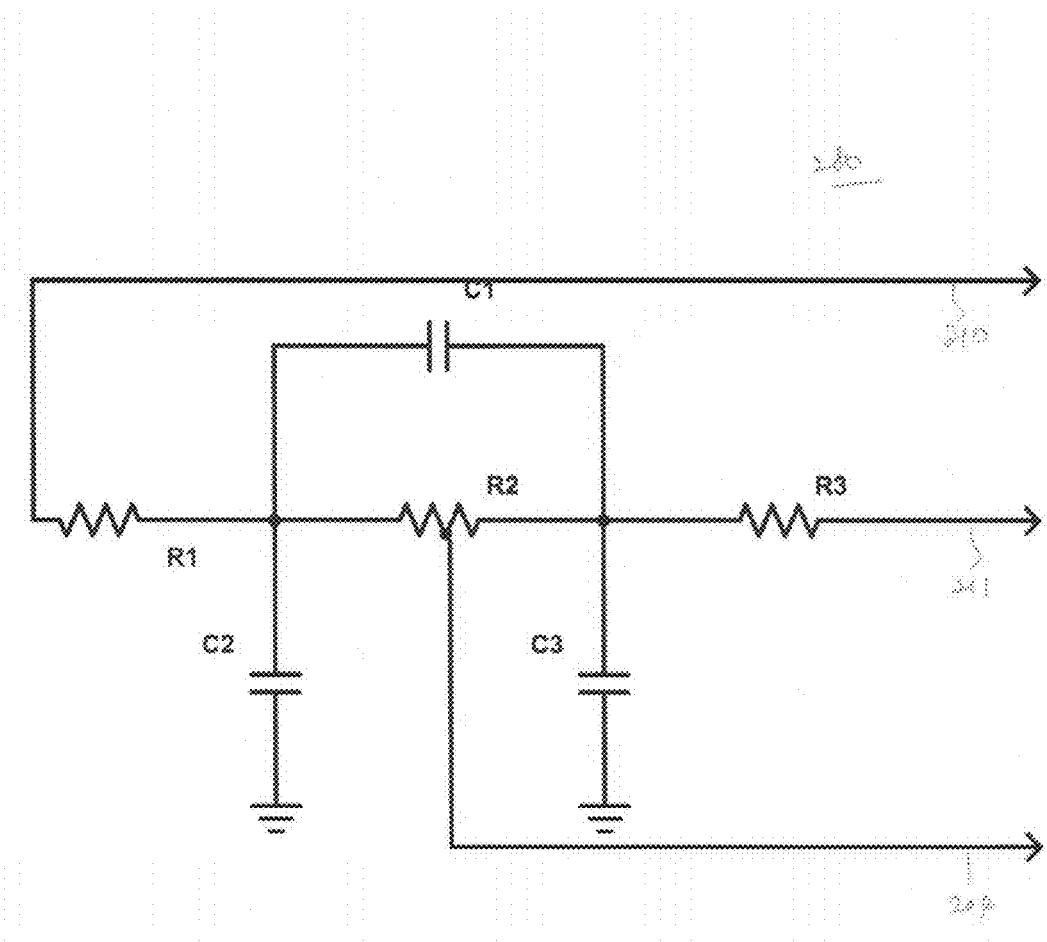
FIG. 4 shows filter circuit 280, which may be used to implement filter circuit 208 of reference voltage generation circuit 200 of FIG. 2, in accordance with one embodiment of the present invention.

FIG. 4 shows filter circuit 280, which may be used to implement filter circuit 208 of reference voltage generation circuit 200 of FIG. 2, in accordance with one embodiment of the present invention. As shown in FIG. 4, filter circuit 280 includes resistors of values $R_1$, $R_2$ and $R_3$ and capacitors of values $C_1$, $C_2$, and $C_3$. If the values $R_1$ and $R_3$ are selected to be equal, and the values $C_2$ and $C_3$ are selected to be equal, the transfer function will have zeroes at $R_1C_2$, $R_2C_2$ and $R_1C_1$. These zeroes can be used to attenuate noise from specific sources.

The above detailed description is provided to illustrate specific embodiments of the present invention and is not intended to be limiting. Numerous variations and modifications within the scope of the present invention are possible. The present invention is set forth in the following claims.

We claim:

1. A reference voltage generation circuit connected between a power supply voltage source and ground, providing a reference voltage at an output terminal, comprising:
   a native MOS transistor having a gate terminal, a source terminal and a drain terminal, the drain terminal being coupled to the power supply voltage source, and the source terminal being coupled to the output terminal to provide the reference voltage;
   an enhancement mode MOS transistor having a gate terminal, a drain terminal and a source terminal, the drain terminal being coupled to the output terminal, and the source terminal being coupled to ground; and
   a filter circuit coupled to the gate terminal of the native MOS transistor, the gate terminal of the enhancement mode transistor and the output terminal, the filter circuit having a transfer function including one or more zeroes.

2. The reference voltage generation circuit of claim 1, wherein the filter circuit comprises two or more of: resistors, capacitors and inductors.

3. The reference voltage generation circuit of claim 1, wherein the drain terminal of the native MOS transistor is coupled to the power supply voltage source by one or more diode-connected additional MOS native transistor that are connected in series.

4. The reference voltage generation circuit of claim 3, further comprising a switch circuit which, when conducting, allows a current to flow between the power supply voltage source and the additional native MOS transistors.

5. The reference voltage generation circuit of claim 1, wherein one of the zeroes is provided at 217 Hz.

* * * * *